US008878558B2

(12) United States Patent
Kondo

(10) Patent No.: US 8,878,558 B2
(45) Date of Patent: Nov. 4, 2014

(54) LOAD TESTING MACHINE

(71) Applicant: Tatsumi Corporation, Tokyo (JP)

(72) Inventor: Toyoshi Kondo, Tokyo (JP)

(73) Assignee: Tatsumi Corporation, Tokyo (JP)

( * ) Notice: Subject to any disclaimer, the term of this patent is extended or adjusted under 35 U.S.C. 154(b) by 0 days.

(21) Appl. No.: 14/228,178

(22) Filed: Mar. 27, 2014

(65) Prior Publication Data

US 2014/0210495 A1 Jul. 31, 2014

Related U.S. Application Data

(63) Continuation of application No. PCT/JP2013/004964, filed on Aug. 22, 2013.

(30) Foreign Application Priority Data

Jan. 21, 2013 (WO) .................. PCT/JP2013/000249
May 30, 2013 (WO) .................. PCT/JP2013/003433

(51) Int. Cl.
*G01R 31/00* (2006.01)
*G01R 31/40* (2014.01)

(52) U.S. Cl.
CPC .................................... *G01R 31/40* (2013.01)
USPC ....... 324/750.01; 324/415; 324/429; 324/558

(58) Field of Classification Search
CPC ...... H01G 1/00; H01G 2004/00; H01L 21/00; G01R 1/00; G01R 2019/00
USPC ..................... 324/415, 429, 558, 559, 750.01
See application file for complete search history.

(56) References Cited

U.S. PATENT DOCUMENTS

| | | | | |
|---|---|---|---|---|
| 5,281,908 A * | 1/1994 | Kondo | ..................... | 324/765.01 |
| 6,078,171 A * | 6/2000 | Kondoh | ......................... | 323/354 |
| 6,653,928 B1 * | 11/2003 | Kondo | ......................... | 338/319 |
| 8,610,446 B2 * | 12/2013 | Yoshida et al. | .......... | 324/750.14 |
| 2005/0093522 A1 * | 5/2005 | Kondo | ............................. | 322/99 |
| 2012/0126839 A1 * | 5/2012 | Schaefer et al. | .......... | 324/750.01 |
| 2012/0217985 A1 * | 8/2012 | Amanuma | ............... | 324/750.01 |

FOREIGN PATENT DOCUMENTS

JP   2010-025752 A   2/2010

* cited by examiner

*Primary Examiner* — Huy Q Phan
*Assistant Examiner* — Temilade S Rhodes-Vivour
(74) *Attorney, Agent, or Firm* — Osha Liang LLP

(57) ABSTRACT

A load testing machines includes: six resistance units; six cooling fans; insulators between the resistance units and the cooling fans; and connection cables, in which: each of the resistance units includes a plurality of steps of resistor groups arranged in a z-direction and each formed of a plurality of rod-shaped resistors parallel to a x-direction connected together in series arranged at predetermined intervals in a y-direction; the six cooling fans face the resistance units, respectively, in the z-direction; the connection cables are cables used for serially and detachably connecting resistor groups next to each other in the y-direction of two resistance units next to each other in the y-direction with an interval of not smaller than a second distance in between; and the insulators each have a size corresponding to the rated voltage of a target power supply of a power supply load test to be conducted using a resistance unit group.

9 Claims, 11 Drawing Sheets

US 8,878,558 B2

LOAD TESTING MACHINE

TECHNICAL FIELD

The present invention relates to load testing machines used when electrical load tests are conducted on power supplies such as alternating-current generators.

BACKGROUND ART

A dry-type load testing machine has been proposed that uses a resistance unit including an alignment of rod-shaped resistors.

CITATION LIST

Patent Literature

Patent Literature 1: JP 2010-025752 A

SUMMARY OF INVENTION

Technical Problem

The proposed dry-type load testing machine is, however, disadvantageous in that when a power supply to be subjected to a load test has large voltages, it is necessary to increase the size of a resistance unit, or to connect a plurality of resistance units in series, or to lower the voltage of the target power supply of the load test by a transformer. When a plurality of resistance units are connected together in series, the number of resistors (or the number of resistor groups each containing resistors) is increased and management of, for example, the number of resistors used for a load test is thus more complicated.

An object of the present invention is therefore to provide a load testing machine capable of conducting a load test with a simple controlling even when a target power supply of a load test has large voltages.

Solution to Problem

A load testing machine according to the present invention includes: a first resistance unit to a sixth resistance unit; a first cooling fan to a sixth cooling fan; insulators between the first to sixth resistance units and the first to sixth cooling fans; and connection cables, wherein each of the first to sixth resistance units includes a plurality of steps of resistor groups each formed of a plurality of rod-shaped resistors parallel to a x-direction connected together in series arranged at predetermined intervals in a y-direction vertical to the x-direction, the resistor groups being arranged in a z-direction vertical to the x-direction and the y-direction, the first to sixth cooling fans face the first to sixth resistance units, respectively, in the z-direction, the first to third resistance units are arranged in the x-direction at intervals of not smaller than a first distance, the fourth to sixth resistance units are arranged in the x-direction at intervals of not smaller than the first distance, the first and fourth resistance units are arranged in the y-direction at an interval of not smaller than a second distance, the second and fifth resistance units are arranged in the y-direction at an interval of not smaller than the second distance, the third and sixth resistance units are arranged in the y-direction at an interval of not smaller than the second distance, the connection cables are cables used for serially and detachably connecting, at more than one part, resistor groups next to each other in the y-direction of two resistance units next to each other in the y-direction with the interval of not smaller than the second distance in between, and the insulators each have a size corresponding to a rated voltage of a target power supply of a power supply load test to be conducted using a resistance unit group, the resistance unit group having serially connected resistors of two resistance units next to each other in the y-direction with the interval of not smaller than the second distance in between.

With the connection cables, resistor groups next to one another in the y-direction of the two resistance units are connected together in series.

In this case, since a resistance value twice as large as the resistance value of a single resistance unit can be obtained with a single resistance unit group, it is possible to conduct, with one resistance unit group, a load test on a power supply having a voltage twice as large as the voltage of a target power supply of a load test that can be conducted with one resistance unit.

Specifically, when each of the first to sixth resistance units has specifications corresponding to a 6600-volt three-phase alternating-current power supply, it is possible to conduct a load test on a 13200-volt three-phase alternating-current power supply by combining the six resistance units in pairs and forming three different resistance unit groups.

Although a voltage applied to one resistance unit group is twice as large as a voltage applied to one resistance unit, sufficient isolation for separation is ensured and insulation from the peripheral devices of the resistance units such as the first cooling fan to the sixth cooling fan can be maintained even when the double voltage is applied, since an insulator to be used has specifications which consider a voltage to be applied to one resistance unit group.

Since the connection cables are connected to their corresponding resistor groups, it is easier to control switching of the resistor groups at a load test, compared to in a case where two resistance units are connected together only at one part (at one terminal of one resistor).

The first to sixth resistance units and the first to sixth cooling fans may consider the voltage of a target power supply of a load test that can be conducted with one resistance unit. Hence, this configuration can be realized using ready-made parts more easily than a configuration in which the number or the lengths of the resistors are increased so that specifications similar to the specifications that can be obtained with one resistance unit group can be obtained with one resistance unit.

Further, compared to when the connection cables are used for a load test, lower-voltage power supplies can be subjected to a load test when the connection cables are easily removed from the resistors and only the first to third resistance units (or only the fourth to sixth resistance units) are used for the load test.

Preferably, the first to sixth resistance units, the first to sixth cooling fans, the insulators, and the connection cables are contained in a luggage room, and the luggage room has a longitudinal direction parallel to the x-direction.

Further, since the resistors extend in the x-direction (the longitudinal direction of the luggage room), it is hardly necessary to change the size of each resistance unit in the y-direction if the rod-shaped member forming each resistor is made longer, and there is less limitation on loading a load testing machine on a transporting means such as a trailer, a truck, or a railroad car (the resistors cannot be made longer than a specified length when the resistors are formed to extend in the y-direction, since a vehicle has only a limited width in the y-direction).

Hence, it is easier to place a dry-type load testing machine into the luggage room and move the luggage room by loading the luggage room on a transporting means such as a trailer, a truck or a railroad car.

Further, preferably, the interval of not smaller than the second distance is provided for obtaining insulation between resistance units next to each other in the y-direction, and the first distance is larger than the second distance and is not shorter than 60 cm.

Further, provision of isolation of not smaller than the first distance makes it possible to obtain an insulation level between the resistance units in the x-direction higher than the insulation level obtained in a configuration in which such isolation is not provided, and enables a worker to enter a space between the resistance units and easily perform tasks of, for example, interconnection (in particular, removing and attaching the connection cables). Moreover, provision of isolation of not smaller than the second distance makes it possible to obtain an insulation level between the resistance units in the y-direction higher than the insulation level obtained in a configuration in which such isolation is not provided.

Further, preferably, the insulators are provided between the first resistance unit and the fourth resistance unit, between the second resistance unit and the fifth resistance unit, and between the third resistance unit and the sixth resistance unit.

Although a voltage applied to one resistance unit group is twice as large as a voltage applied to one resistance unit, sufficient isolation for separation is ensured and insulation between the resistance units can be maintained even when the double voltage is applied, since an insulator to be used has specifications which consider a voltage to be applied to one resistance unit group. Further, collisions between the resistance units due to movement at the transportation, for example, can be prevented.

Further, preferably, cylindrical hoods are provided between the first to sixth cooling fans and the first to sixth resistance units so that cooling wind from the first to sixth cooling fans is introduced to the first to sixth resistance units, and an upper part of each cylindrical hood is located in the inside of a casing covering sides of the resistor group at a lowermost step and is separated from the casing at a distance of not smaller than 1 cm.

The hood and the casing are formed of an insulating material, and insulation can be maintained without dusts stored in between by providing isolation between the hood and the casing.

A load testing machine according to the present invention includes: a first resistance unit to a sixth resistance unit; a first cooling fan to a sixth cooling fan; insulators between the first to sixth resistance units and the first to sixth cooling fans; and either connection cables or short-circuit bars, wherein each of the first to sixth resistance units includes a plurality of steps of resistor groups each formed of a plurality of rod-shaped resistors parallel to a x-direction arranged at predetermined intervals in a y-direction vertical to the x-direction, the resistor groups being arranged in a z-direction vertical to the x-direction and the y-direction, the first to sixth cooling fans face the first to sixth resistance units, respectively, in the z-direction, the first to third resistance units are arranged in the x-direction at intervals of not smaller than a first distance, the fourth to sixth resistance units are arranged in the x-direction at intervals of not smaller than the first distance, the first and fourth resistance units are arranged in the y-direction at an interval of not smaller than a second distance, the second and fifth resistance units are arranged in the y-direction at an interval of not smaller than the second distance, the third and sixth resistance units are arranged in the y-direction at an interval of not smaller than the second distance, either the connection cables or the short-circuit bars are connection members used for serially and detachably connecting, at more than one part, resistor groups next to each other in the y-direction of two resistance units next to each other in the y-direction with the interval of not smaller than the second distance in between, and the insulators each have a size corresponding to a rated voltage of a target power supply of a power supply load test to be conducted using a resistance unit group, the resistance unit group having serially connected resistor groups of two resistance units next to each other in the y-direction with the interval of not smaller than the second distance in between.

Preferably, either the connection cables or the short-circuit bars are connected to the resistor groups via a switching member, the switching member including a case containing a fixed contact point, a movable contact point, and a driving member that drives the movable contact point and being filled with an inert gas.

If the connection cable or the short-circuit bar is connected to the switching members in an off-state in which the fixed contact point and the movable contact point are not in contact with each other, it is possible to reduce a user's risk of getting electrical shock due to leakage of currents of the resistance units to the outside when the user is holding the connection cable or the short-circuit bar.

Moreover, since the case is filled with an inert gas, the possibility of generation of a spark is low between the fixed contact point and the movable contact point in the off-state (or a state immediately before the on-state) where the fixed contact point and the removable contact point are not in contact with each other.

Further preferably, the switching member has a first terminal and a second terminal, the first terminal being connected to one of the resistors forming the resistor groups and the second terminal being connected to either the connection cable or the short-circuit bar, and an insulating wall is formed between the first terminal and the second terminal.

It is possible to prevent the connection cable or the short-circuit bar to be attached to the second terminal from becoming in contact with the first terminal by mistake when being attached to the second terminal.

Further, preferably, the switching member has a first cable and a second cable, the first cable extending from the inside of the case and being connected to one of the resistors forming the resistor groups and the second cable being connected to either the connection cable or the short-circuit bar, a region of the inside of the case which contains the fixed contact point and the movable contact point is covered with an internal case, the inside of the internal case is filled with an inert gas, and a region between the case and the internal case which includes at least an area between the first cable and the second cable is filled with an insulating material.

It becomes possible to prevent easy occurrence of short-circuit between the first cable and the second cable by covering the region with the insulating material.

Advantageous Effects of Invention

As described above, according to the present invention, a load testing machine can be provided capable of conducting a load test with a simple controlling even when a power supply to be subjected to the load test has large voltages.

DESCRIPTION OF EMBODIMENTS

Figure 1:
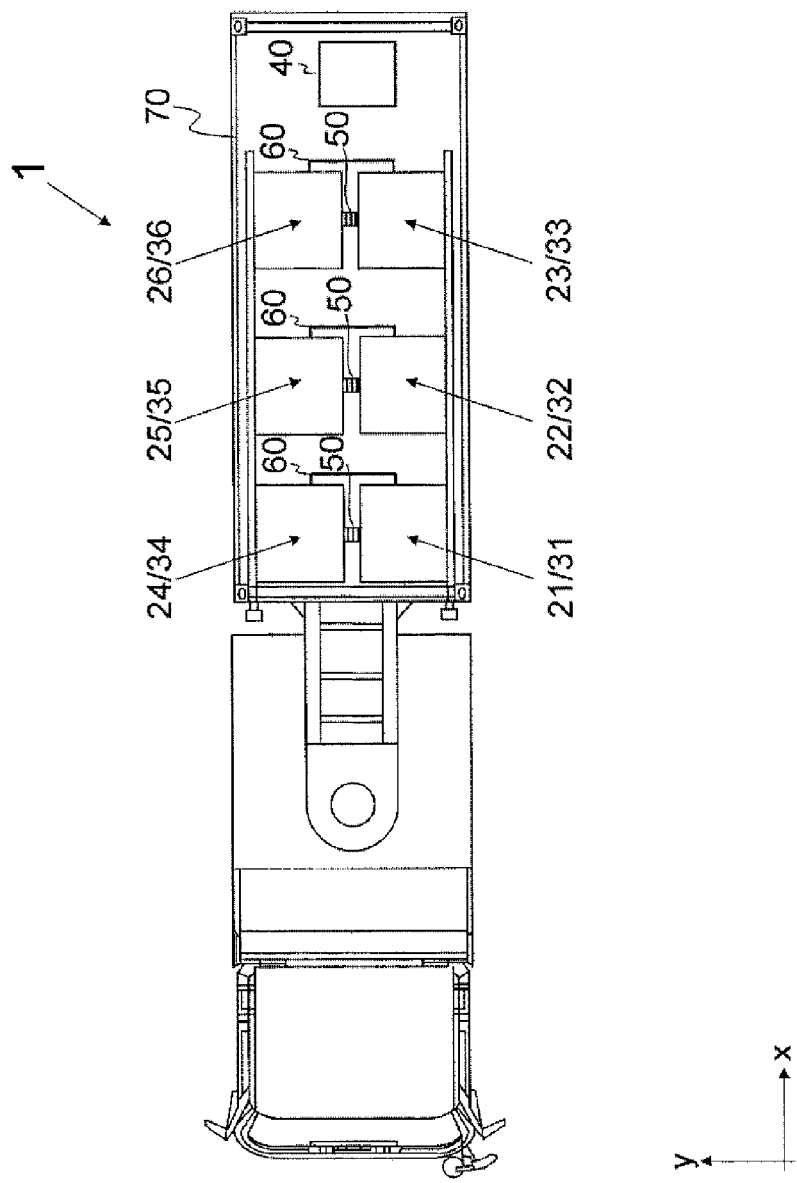
FIG. 1 is a top view illustrating a trailer equipped with a load-carrying box containing a dry-type load testing machine according to the present embodiment.
Figure 2:
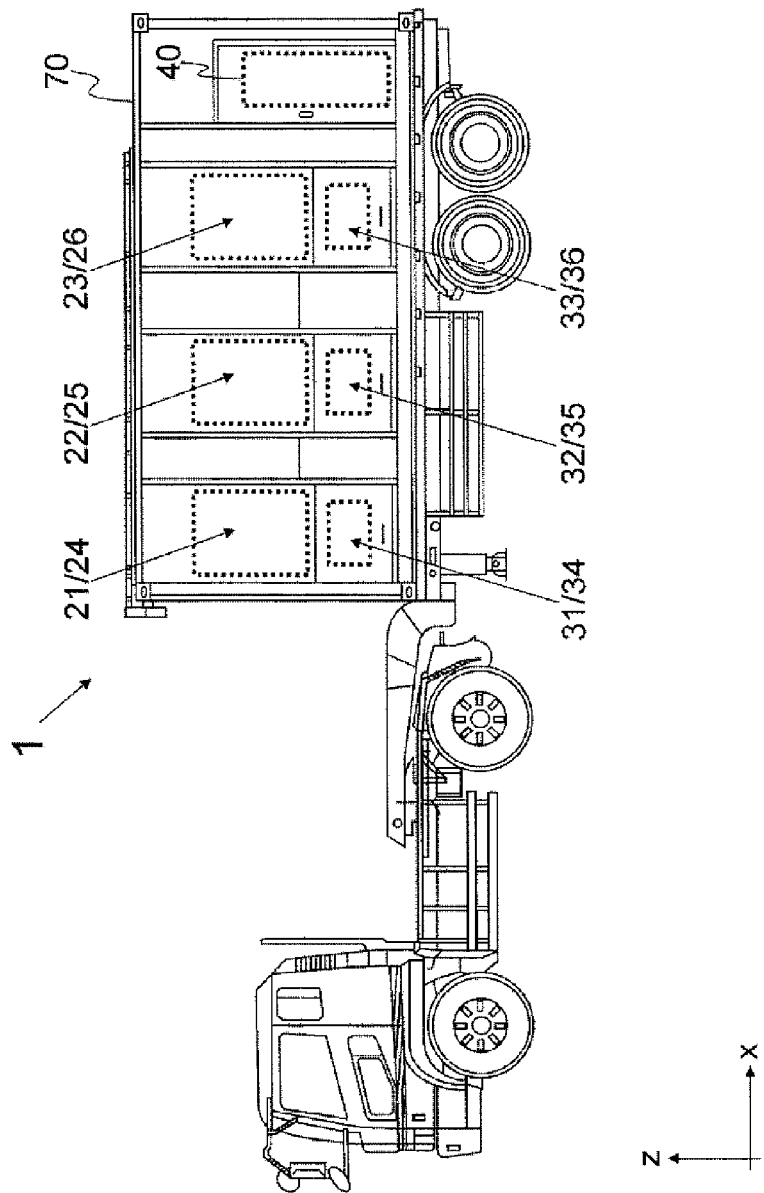
FIG. 2 is a side view illustrating the trailer equipped with the load-carrying box containing the dry-type load testing machine according to the present embodiment.
Figure 3:
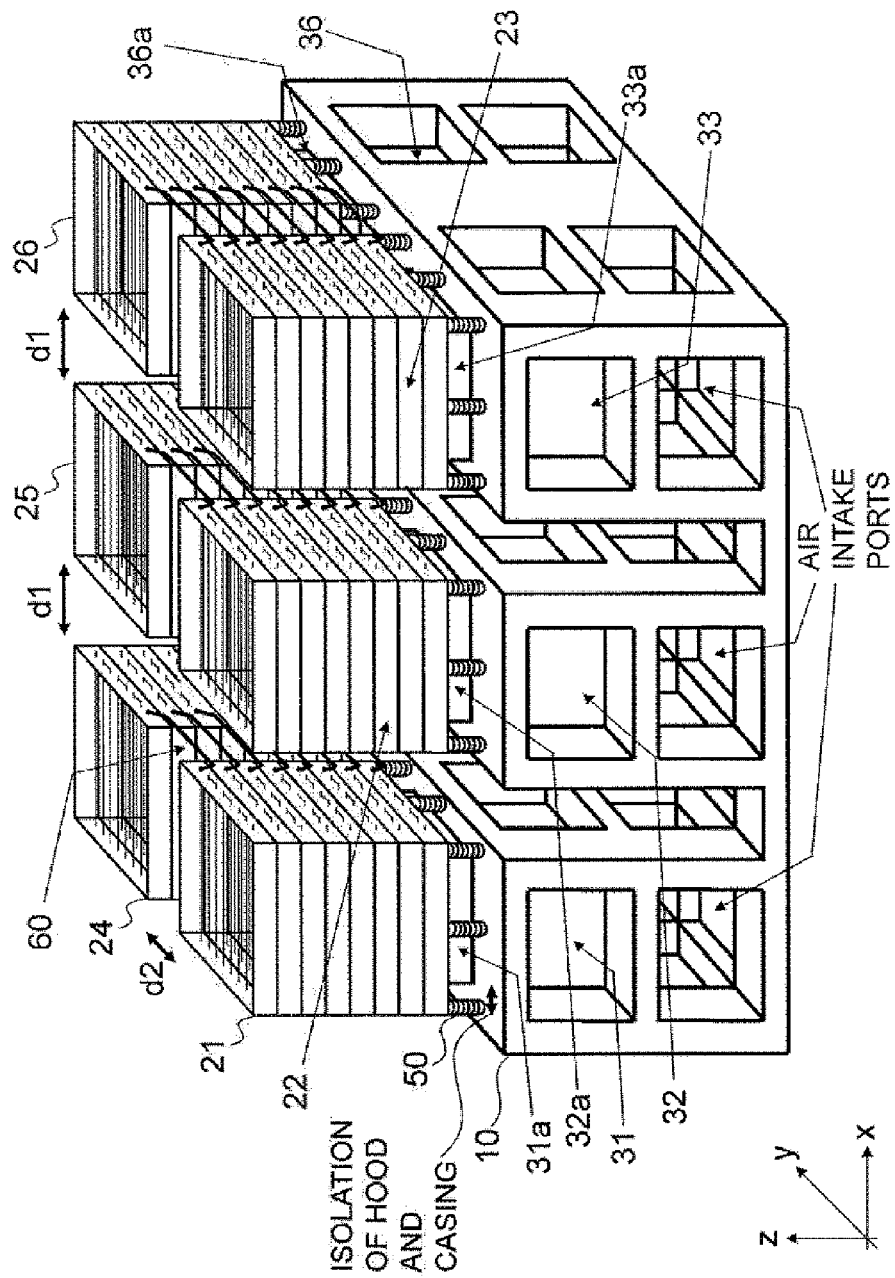
FIG. 3 is a perspective view illustrating the arrangement of the first to sixth resistance units, the frame, the insulators, and the first to sixth cooling fans.
Figure 4:
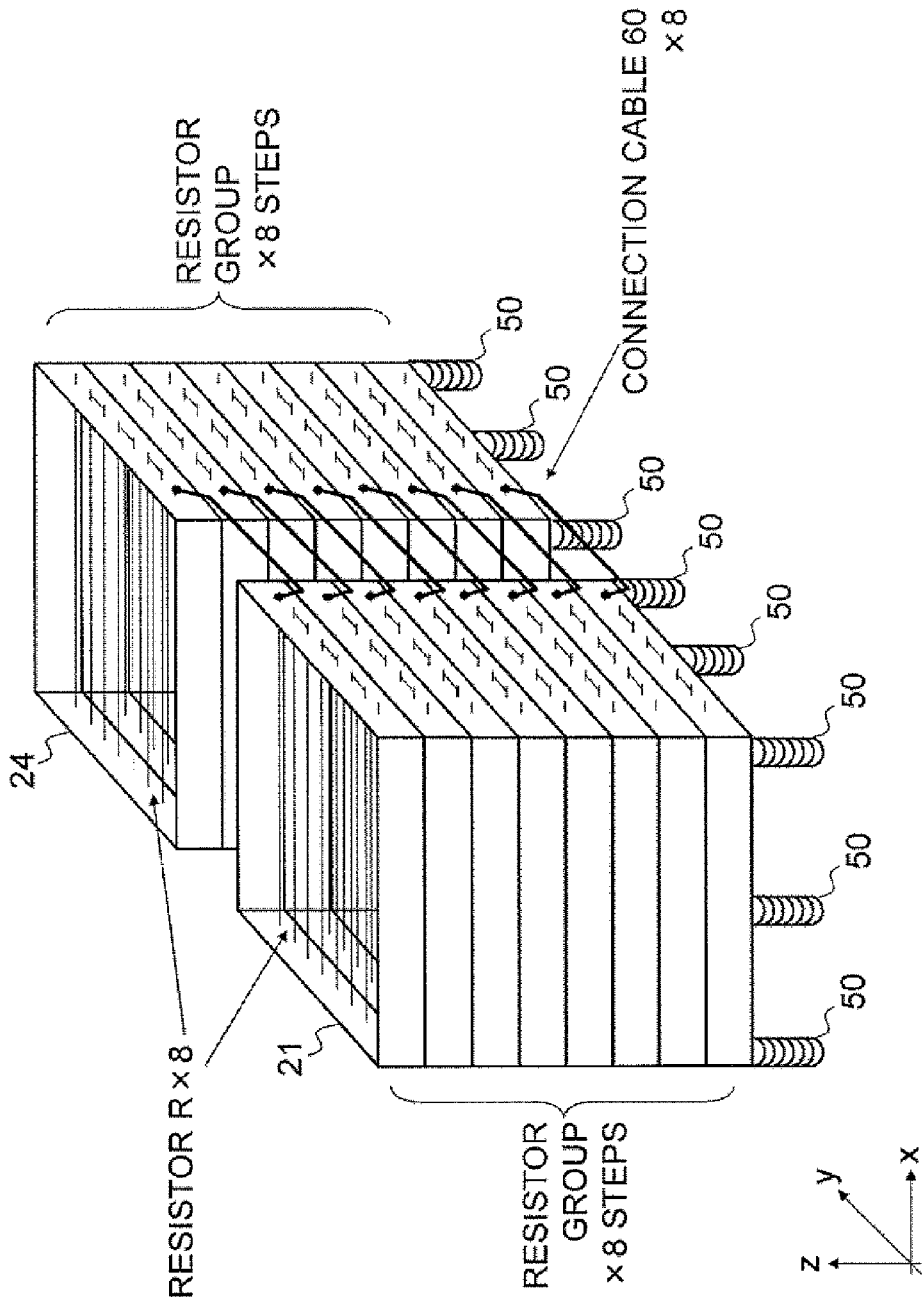
FIG. 4 is a perspective view illustrating the arrangement of the first and fourth resistance units and the insulators.

The present embodiment will be hereinafter described with reference to the drawings. A dry-type load testing machine 1 according to the present invention includes a frame 10, a first resistance unit 21 to a sixth resistance unit 26, a first cooling fan 31 to a sixth cooling fan 36, a connection switching section 40, insulators 50, and connection cables 60 (FIGS. 1 to 5).

The frame 10 has such a size that a luggage room 70 of a container (or high-cube container) can contain the frame 10, and the first to sixth resistance units 21 to 26 are fixed on the frame 10 with the insulator 50 in between. A base plate or a vibration-proof insulating rubber, for example, (not shown in the drawings) may be provided between the insulator 50 and the frame 10.

For the explanation of directions, a direction in which a transporting means, such as a trailer (or a truck or a railroad car), loaded with the luggage room 70 travels (the longitudinal direction of the luggage room 70) is denoted by a x-direction, a horizontal direction vertical to the travelling direction is denoted by a y-direction, and a perpendicular direction vertical to the x-direction and the y-direction is denoted by a z-direction.

Each of the first resistance unit 21 to the sixth resistance unit 26 includes a plurality of steps of resistor groups arranged in the z-direction to connect together in parallel, each of the resistor groups being formed of a plurality of rod-shaped resistors R parallel to the x-direction connected together in series arranged at predetermined intervals in the y-direction. The resistance units are used for conducting a load test on a power supply such as a power generator under different conditions of the load (voltage) of the power supply, set by changing a resistor group to be used, a method for connecting the first resistance unit 21 to the third resistance unit 23 (or the fourth resistance unit 24 to the sixth resistance unit 26) for, for example, neutral connection, or a method for connecting the resistor groups.

Although the present embodiment will be described on the assumption that each of the first resistance unit 21 to the sixth resistance unit 26 has 8 steps of resistor groups arranged in the z-direction to connect together in parallel, each of which being formed of 8 rod-shaped resistors R parallel to the x-direction connected together in series with for example, short-circuit bars arranged at predetermined intervals in the y-direction, the number of resistors R arranged in each resistor group and the number of steps of the resistor groups are not limited to the numbers as described above.

Each resistor group has openings in the upper and the lower surfaces thereof for allowing cooling wind from the cooling fans at the lower part to flow upward, and is covered with a casing of an insulating material at the side surfaces thereof in order to increase the insulation level between the resistor group and the resistor unit next thereto.

The serially connected resistor R forming each resistor group is connected to the connection switching section 40 by cables (not shown in the drawings) at their respective edges at at least one side (at a side which is not connected to the connection cables 60 described later).

In order to perform cooling with the cooling fans efficiently, the resistors R of the resistor groups are arranged so that the resistors R of the resistor groups next to each other in the z-direction are arranged at positions intermediate between the resistors R forming the resistor groups and the resistors R next to the above resistors R in the y-direction.

The first resistance unit 21 to the third resistance units 23 are arranged in the x-direction at intervals of not smaller than a first distance d1, and the fourth resistance unit 24 to the sixth resistance units 26 are arranged in the x-direction at intervals of not smaller than the first distance d1. The first distance d1 is desirably larger than a length that needs to be kept between resistance units next to each other in the x-direction so that insulation can be obtained therebetween (for example, the first resistance unit 21 and the second resistance unit 22), and is desirably a length (for example, approximately 60 cm) that enables a worker to enter the space between the resistance units and perform tasks.

The first resistance unit 21 and the fourth resistance unit 24 are arranged in the y-direction at an interval of not smaller than a second distance d2, the second resistance unit 22 and the fifth resistance unit 25 are arranged in the y-direction at an interval of not smaller than the second distance d2, and the third resistance unit 23 and the sixth resistance unit 26 are arranged in the y-direction at an interval of not smaller than the second distance d2. The second distance d2 is desirably a length (for example, approximately 11 cm) that needs to be kept between resistance units next to each other in the y-direction so that insulation can be obtained therebetween (for example, the first resistance unit 21 and the fourth resistance unit 24).

The first resistance unit 21 and the fourth resistance unit 24 are used for an R-phase load test, the second resistance unit 22 and the fifth resistance unit 25 are used for an S-phase load test, and the third resistance unit 23 and the sixth resistance unit 26 are used for a T-phase load test The first cooling fan 31 to the sixth cooling fan 36 are attached at positions under the first resistance unit 21 to the sixth resistance unit 26, respectively, and in the upper part of the inside of the frame 10. Further, air intake ports of the first cooling fan 31 to the sixth cooling fan 36 are provided, respectively, in the sides of the lower part and the bottom of the inside of the frame 10.

Between the first cooling fan 31 to the sixth cooling fan 36 and the first resistance unit 21 to the sixth resistance unit 26, cylindrical hoods (first hood 31a to sixth hood 36a) are provided, respectively, that introduce cooling wind from the first cooling fan 31 to the sixth cooling fan 36 to the first resistance unit 21 to the sixth resistance unit 26, respectively. The upper part of each cylindrical hood is located in the inside of the casing covering sides of the resistor group at the lowermost step, and is desirably separated from the casing at a distance of not smaller than 1 cm. The hood and the casing are formed of an insulating material, and insulation can be maintained without dusts stored in between by providing isolation between the hood and the casing.

The first resistance unit 21 to the sixth resistance unit 26 each have specifications (the number of resistors R, the resistance value, etc.) corresponding to the rated voltage of a target power supply of a power supply load test to be conducted in a state in which the resistance units are not connected together in series.

Specifically, each of the first resistance unit 21 to the sixth resistance unit 26 has specifications (the number of resistors R, the resistance value, etc.) corresponding to the rated voltage of a target power supply of a three-phase alternating-current power supply load test to be conducted using three of the first resistance unit 21 to the sixth resistance unit 26.

The first cooling fan 31 to the sixth cooling fan 36 each have specifications (for example, cooling capability of fans) for cooling the first resistance unit 21 to the sixth resistance unit 26, respectively, at a power supply load test.

The connection switching section 40, which has a switching device and a control device such as a CPU, serves to change connection to a target power supply of a load test, a resistor group to be used, a method for connecting the first resistance unit 21 to the third resistance unit 23 (or the fourth resistance unit 24 to the sixth resistance unit 26) together for, for example, neutral connection, and a method for connecting the resistor groups. Further, a load test can be conducted on a direct-current power supply by connecting the resistance units in series.

The insulator 50 is used for insulating the first resistance unit 21 to the sixth resistance unit 26 to which high voltages are applied from the peripheral devices (the frame 10, the first cooling fan 31 to the sixth cooling fan 36, for example).

Figure 5:
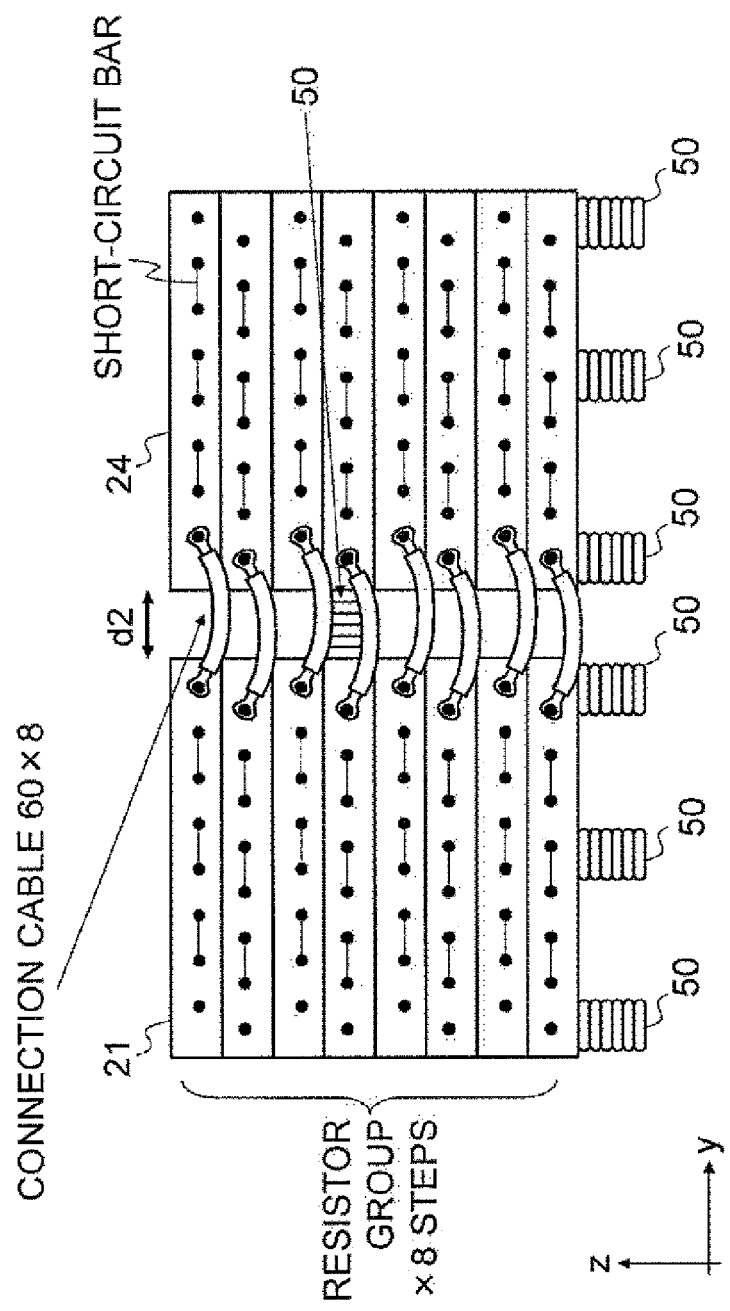
FIG. 5 is a back view illustrating the arrangement of the first and fourth resistance units and the insulators.

Further, the insulator 50 is desirably provided as well between the first resistance unit 21 and the fourth resistance unit 24, between the second resistance unit 22 and the fifth resistance unit 25, and between the third resistance unit 23 and the sixth resistance unit 26 in order that insulation can be obtained between the resistance units next to each other in the y-direction and that collisions can be prevented between the resistance units due to movement at the transportation, for example (see FIGS. 1 and 5).

The insulator 50 has specifications (size, for example) corresponding to the rated voltage of a target power supply of a power supply load test to be conducted using a resistance unit group having serially connected resistor groups of two resistance units next to each other in the y-direction with the second distance d2 in between (the first resistance unit 21 and the fourth resistance unit 24, the second resistance unit 22 and the fifth resistance unit 25, and the third resistance unit 23 and the sixth resistance unit 26). In particular, the insulator 50 provided at the bottom of the resistance unit has a size in the z-direction of not smaller than the second distance d2.

Specifically, the insulator 50 has specifications (size, for example) corresponding to the rated voltage of a target power supply of a three-phase alternating-current power supply load test to be conducted using 3 sets of resistance unit groups each having serially connected resistor groups of two resistance units next to each other in the y-direction with an interval of not smaller than the second distance d2 in between (the first resistance unit 21 and the fourth resistance unit 24, the second resistance unit 22 and the fifth resistance unit 25, and the third resistance unit 23 and the sixth resistance unit 26). In particular, the insulator 50 provided at the bottom of the resistance unit has a size in the z-direction of not smaller than the second distance d2.

In other words, the insulator 50 has specifications corresponding to the rated voltage twice as large as the rated voltage of a target power supply of a load test for which each of the first resistance unit 21 to the sixth resistance unit 26 and the first cooling fan 31 to the sixth cooling fan 36 has specifications.

For example, when each of the first resistance unit 21 to the sixth resistance unit 26 has specifications for a 6600-volt three-phase alternating-current power supply, an insulator 50 having specifications for a 13200-volt three-phase alternating-current power supply is used. In this case, the insulator 50 has a length larger by a few centimeters than an insulator having specifications for a 6600-volt three-phase alternating-current power supply.

The connection cable 60 is a cable used for serially and detachably connecting, at more than one part, resistor groups (resistors R of resistor groups) next to each other in the y-direction of two resistance units next to each other in the y-direction with the second distance d2 in between.

The number of prepared connection cables 60 is three times as large as the number of steps of the resistor groups in each resistor unit (in the present embodiment, 8 steps multiplied by 3 is 24 cables). Each of the connection cables 60 connects one terminal of a resistors R forming a resistor group which is close to a resistance unit as a connection destination, with a terminal of a resistor R close to the above terminal forming a resistor group of the resistance unit as the connection destination next to the above terminal in the y-direction.

Although a configuration in which the resistor groups are connected together at their respective steps with the connection cables 60 will be described in the present embodiment, a connection does not always need to be made between each step, and may be made at more than one part of the plurality of the resistor groups with the connection cables 60. It is easier to control switching of the resistor groups at a load test when the above configuration is employed, compared to when two resistance units are connected together in series at only one part (one terminal of one resistor R). The more the connecting parts are, the easier the control of the switch becomes.

Ring terminals (represented by a black circle in FIGS. 3 and 4) are provided at both terminals of each connection cable 60. The connection cables 60 and the resistors R can be connected together in a detachable state in a manner that the ring terminals are retained to fix the terminals of the resistors R and then are screwed (or fixed with bolts).

The luggage room 70 has opening/closing doors at least at positions of the upper surface thereof which face the first resistance unit 21 to the sixth resistance unit 26, at positions of the side surfaces thereof which face the air intake ports of the first cooling fan 31 to the sixth cooling fan 36, and at the back surface thereof. A load test is conducted in a manner that the doors at the side surfaces are opened for letting air in, the doors at the upper surface are opened for letting air out, and the doors at the back surface are opened for electric connection to a target three-phase alternating-current power supply of the load test or operation (load test operation) of the connection switching section 40.

With the connection cables, resistor groups next to one another in the y-direction of the two resistance units are connected together in series.

In this case, since a resistance value twice as large as the resistance value of a single resistance unit can be obtained with a single resistance unit group, it is possible to conduct, with one resistance unit group, a load test on a power supply having a voltage twice as large as the voltage of a target power supply of a load test that can be conducted with one resistance unit.

Specifically, when each of the first resistance unit 21 to the sixth resistance unit 26 has specifications corresponding to a 6600-volt three-phase alternating-current power supply, it is possible to conduct a load test on a 13200-volt three-phase alternating-current power supply by combining the six resistance units in pairs and forming three different resistance unit groups.

Although a voltage applied to one resistance unit group is twice as large as a voltage applied to one resistance unit, sufficient isolation for separation is ensured and insulation from the peripheral devices of the resistance units such as the frame 10 and the first cooling fan 31 to the sixth cooling fan 36 as well as insulation among the resistance units can be maintained even when the double voltage is applied, since an insulator having specifications which consider a voltage to be applied to one resistance unit group is used as the insulator 50.

Since the connection cables 60 are connected to their corresponding resistor groups, it is easier to control switching of the resistor groups at a load test, compared to when two resistance units are connected together only at one part (at one terminal of one resistor R).

The first resistance unit 21 to the sixth resistance unit 26 and the first cooling fan 31 to the sixth cooling fan 36 may consider the voltage of a target power supply of a load test that can be conducted with one resistance unit. Hence, this configuration can be realized using ready-made parts more easily than a configuration in which the number or the lengths of the resistors R are increased so that specifications similar to the specifications that can be obtained with one resistance unit group can be obtained with one resistance unit.

Moreover, since the resistors R extend in the x-direction (the longitudinal direction of the luggage room 70), it is hardly necessary to change the size of each resistance unit in the y-direction if the rod-shaped member forming each resistor R is made longer, and there is less limitation on loading a load testing machine on a transporting means such as a trailer, a truck, or a railroad car (the resistors R cannot be made longer than a specified length when the resistors R are formed to extend in the y-direction, since a vehicle has only a limited width in the y-direction).

Hence, it is easier to place the dry-type load testing machine 1 into the luggage room 70 and move the luggage room 70 by loading the luggage room 70 on a transporting means such as a trailer, a truck or a railroad car.

Further, compared to when the connection cables 60 are used for a load test, lower-voltage power supply can be subjected to a load test when the connection cables 60 are easily removed from the resistors R and only the first to third resistance units 21 to 23 (or only the fourth to sixth resistance units 24 to 26) are used for the load test.

Further, provision of isolation of not smaller than the first distance d1 makes it possible to obtain an insulation level between the resistance units in the x-direction higher than the insulation level obtained in a configuration in which such isolation is not provided, and enables a worker to enter a space between the resistance units and easily perform tasks of, for example, interconnection (in particular, removing and attaching the connection cables 60). Moreover, provision of isolation of not smaller than the second distance d2 makes it possible to obtain an insulation level between the resistance units in the y-direction higher than the insulation level obtained in a configuration in which such isolation is not provided.

Although an example in which the resistors R are serially connected in the resistor groups has been described in the present embodiment, part of or all of the resistors R can be connected together in parallel by changing the manner in which the resistors R are connected at their respective edges. Hence, the manner of connecting the resistors R in the resistor groups may be switched between a parallel connection and a serial connection, using the short-circuit bars or the connection switching section 40. When this manner is employed, it is possible to conduct a load test on a low-voltage three-phase alternating-current power supply by increasing the number of parts in the resistor groups where a parallel connection is made.

Figure 6:
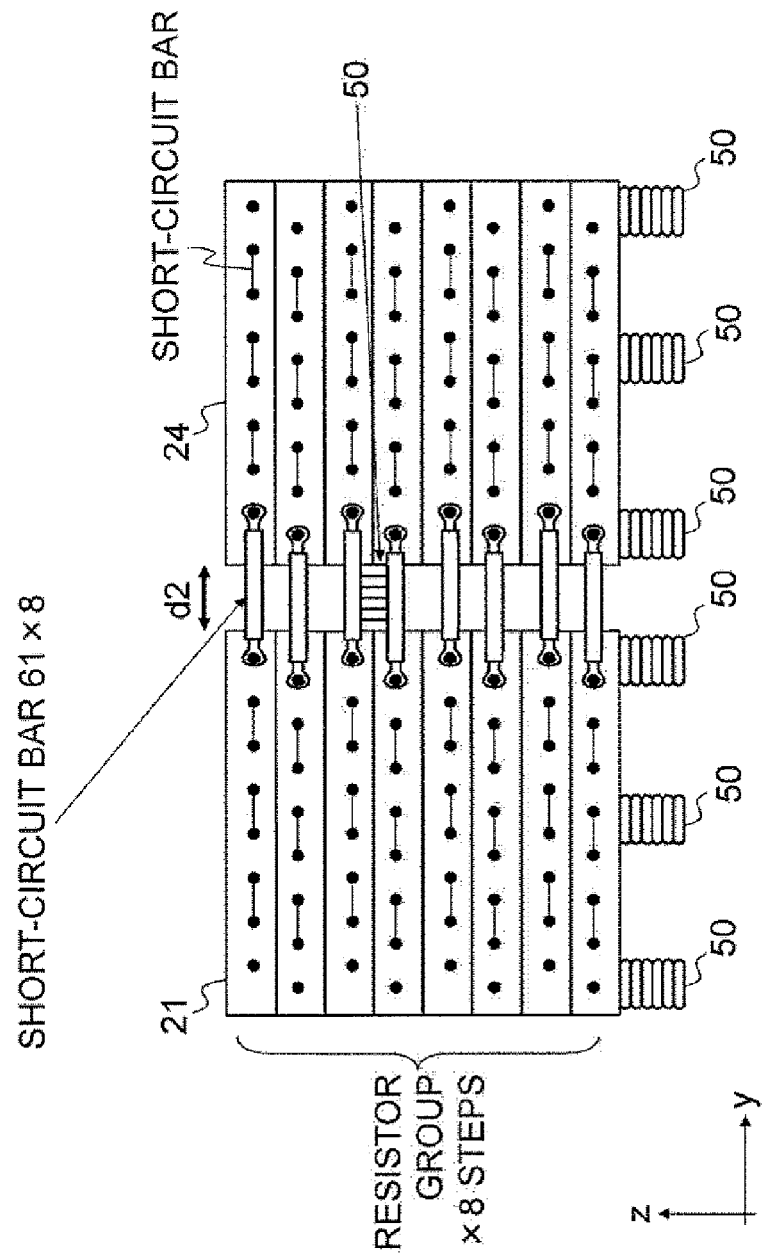
FIG. 6 is a back view illustrating the arrangement of the first and fourth resistance units and the insulators in a configuration in which connection cables in FIG. 5 are replaced by short-circuit bars.
Figure 7:
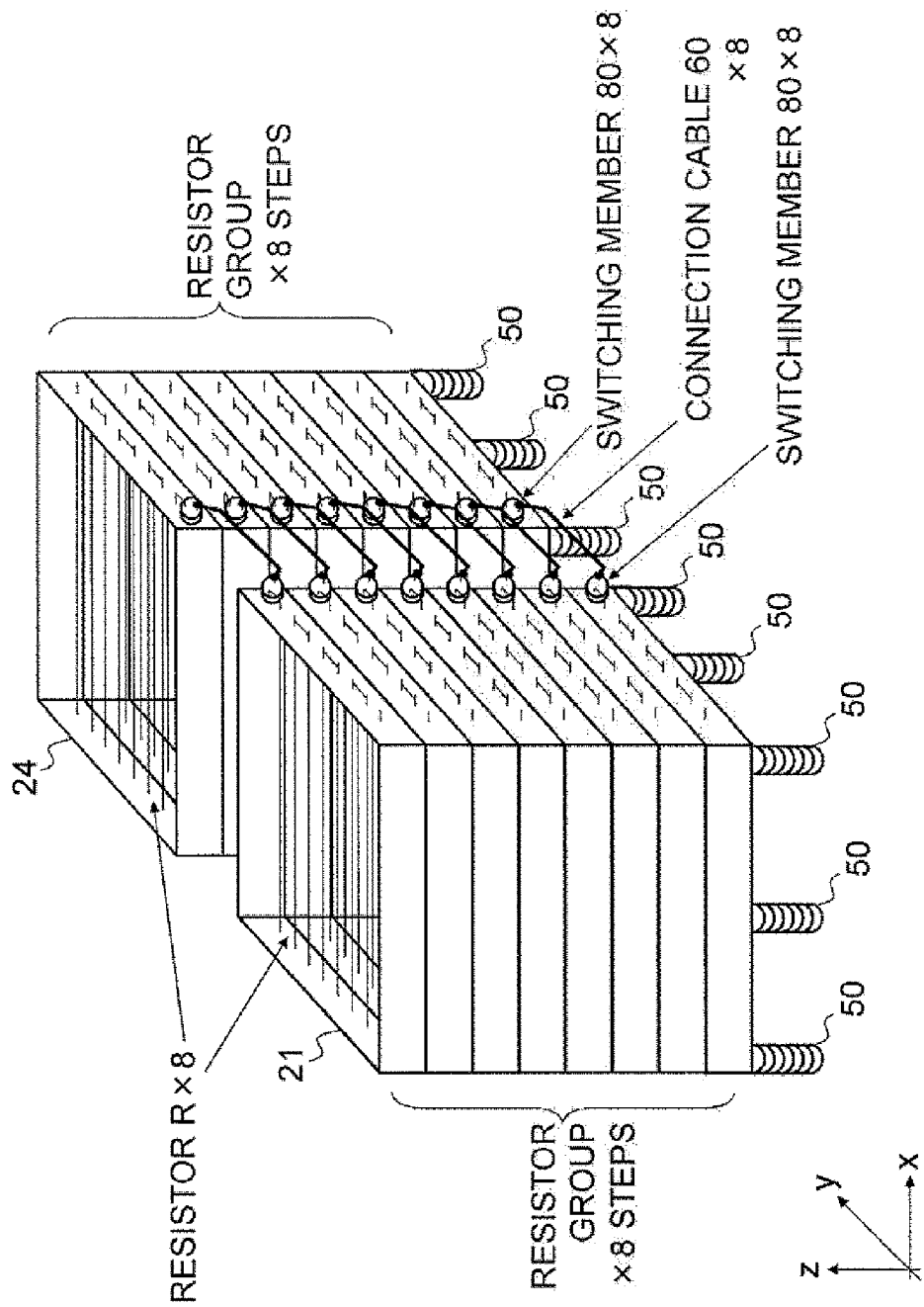
FIG. 7 is a perspective view illustrating the arrangement of the first and fourth resistance units and the insulators in a configuration in which switching members are used for connection.
Figure 8:
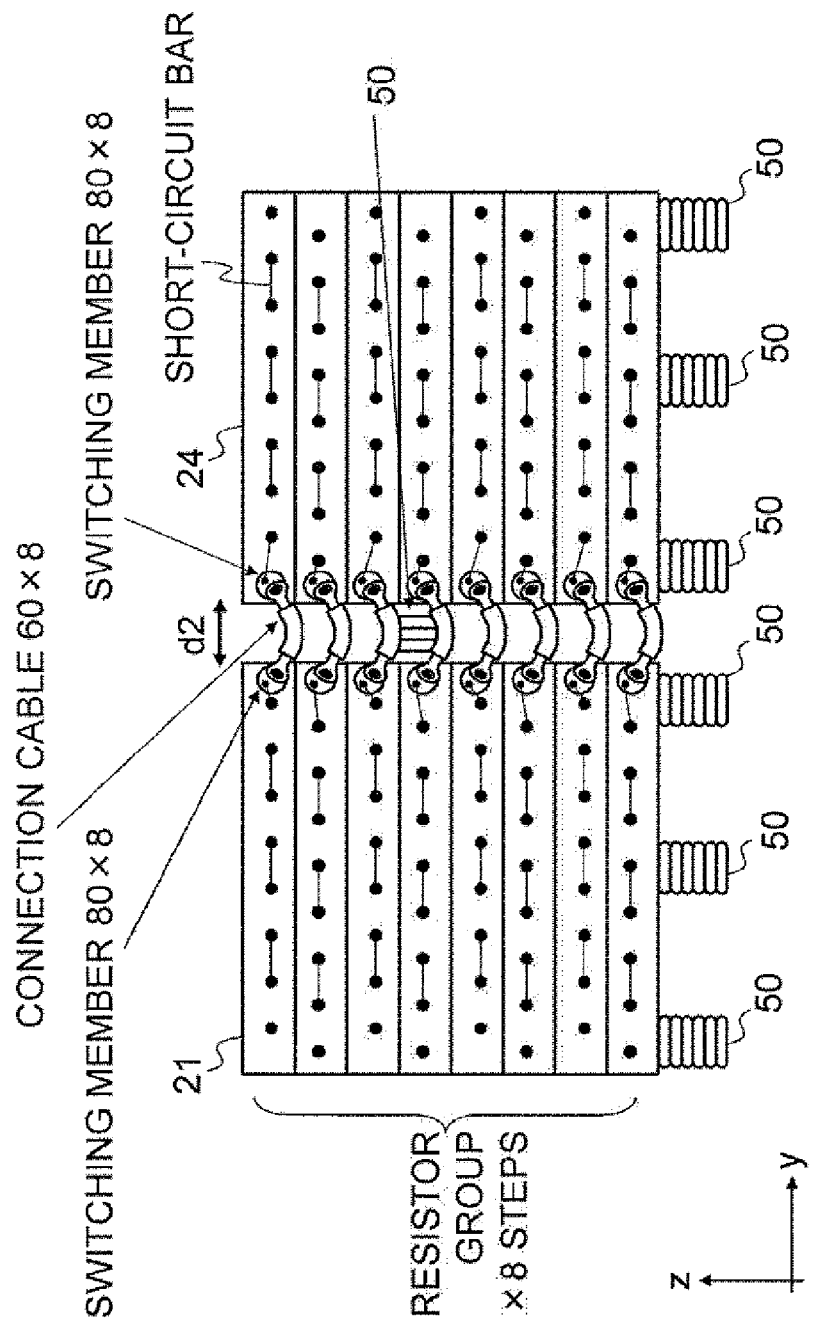
FIG. 8 is a back view illustrating the arrangement of the first and fourth resistance units and the insulators in the configuration in which the switching members are used for connection.
Figure 9:
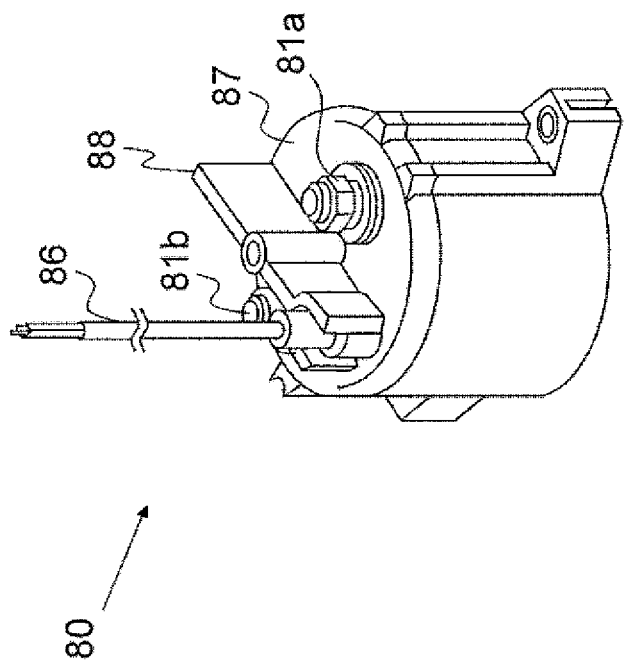
FIG. 9 is a perspective view illustrating each of the switching members.
Figure 10:
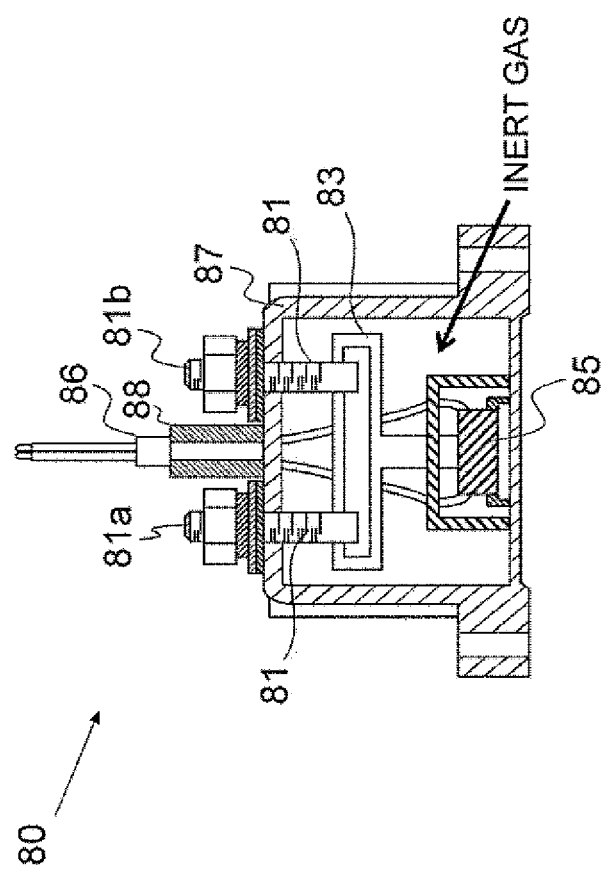
FIG. 10 is a cross-sectional configuration view illustrating each of the switching members.

Moreover, although an example in which the connection cables 60 is used for connecting the resistor group of one resistor unit and the resistor group of another resistor unit has been described in the present embodiment, connection members to be used for connecting the resistor groups together are not limited to the cables. Specifically, a short-circuit bar 61 may be used to connect one resistor group and another resistor group together as a short-circuit bar is used to connect terminals of resistors R together (see FIG. 6).

Moreover, although an example in which the connections of the connection cables 60 or the short-circuit bars 61 with the resistors R are direct connections has been described in the present embodiment, the connections may be made via switching members 80 each including a case 87, the case 87 containing a fixed contact point 81, a movable contact point 83, and a driving member 85 that drives the movable contact point 83 and being filled with an inert gas of, for example, nitrogen (see FIGS. 7 to 10).

Specifically, each switching member 80 has the fixed contact point 81, the movable contact point 83, the driving member 85, a lead line 86, and the case 87, and is set in a position near a terminal of a resistor R of the resistor group which is connected to the connection cable 60 or the short-circuit bar 61.

A terminal (first terminal 81a) of the switching member 80 which protrudes from one fixed contact point 81 to the outside of the case 87 is connected to a terminal of the resistor R, and a terminal (second terminal 81b) thereof which protrudes from the other fixed contact point 81 to the outside of the case 87 is connected to the connection cable 60 or the short-circuit bar 61. The resistors R and the first terminal 81a are constantly connected together, while one of the connection cable 60 and the short-circuit bar 61 is connected to the second terminal 81b only when the resistance units are to be connected together. An insulating wall 88 is desirably provided (see FIG. 9) between the first terminal 81a and the second terminal 81b so that the connection cable 60 or the short-circuit bar 61 to be attached to the second terminal 81b does not become in contact with the first terminal 81a by mistake when is being attached to the second terminal 81b or so that short circuit does not occur between the first terminal 81a and the second terminal 81b.

The movable contact point 83 is driven by the driving member 85 and is switched between an on-state and an off-state (the on-state is a state in which the movable contact point 83 is in contact with the fixed contact point 81 and the off-state is a state in which the movable contact point 83 is not in contact with the fixed contact point 81). The connection cable 60 or the short-circuit bar 61 is connected to the second terminal 81*b* in the off-state.

The driving member 85 is connected to the connection switching section 40 via the lead line 86, and the operation of the driving member 85 (switching between the on-state and the off-state) is controlled by the connection switching section 40.

The case 87 contains the fixed contact point 81, the movable contact point 83, and the driving member 85, and is filled with an inert gas.

If the connection cable 60 or the short-circuit bar 61 is connected to the switching member 80 (the second terminal 81*b*) in the off-state in which the fixed contact point 81 and the movable contact point 83 are not in contact with each other, it is possible to reduce a user's risk of getting electrical shock due to leakage of currents of resistance units to the outside when the user is holding the connection cable 60 or the short-circuit bar 61.

Moreover, since the case 87 is filled with an inert gas, the possibility of generation of a spark is low between the fixed contact point 81 and the movable contact point 83 in the off-state (or a state immediately before the on-state) in which the fixed contact point 81 and the removable contact point 83 are not in contact with each other.

Figure 11:
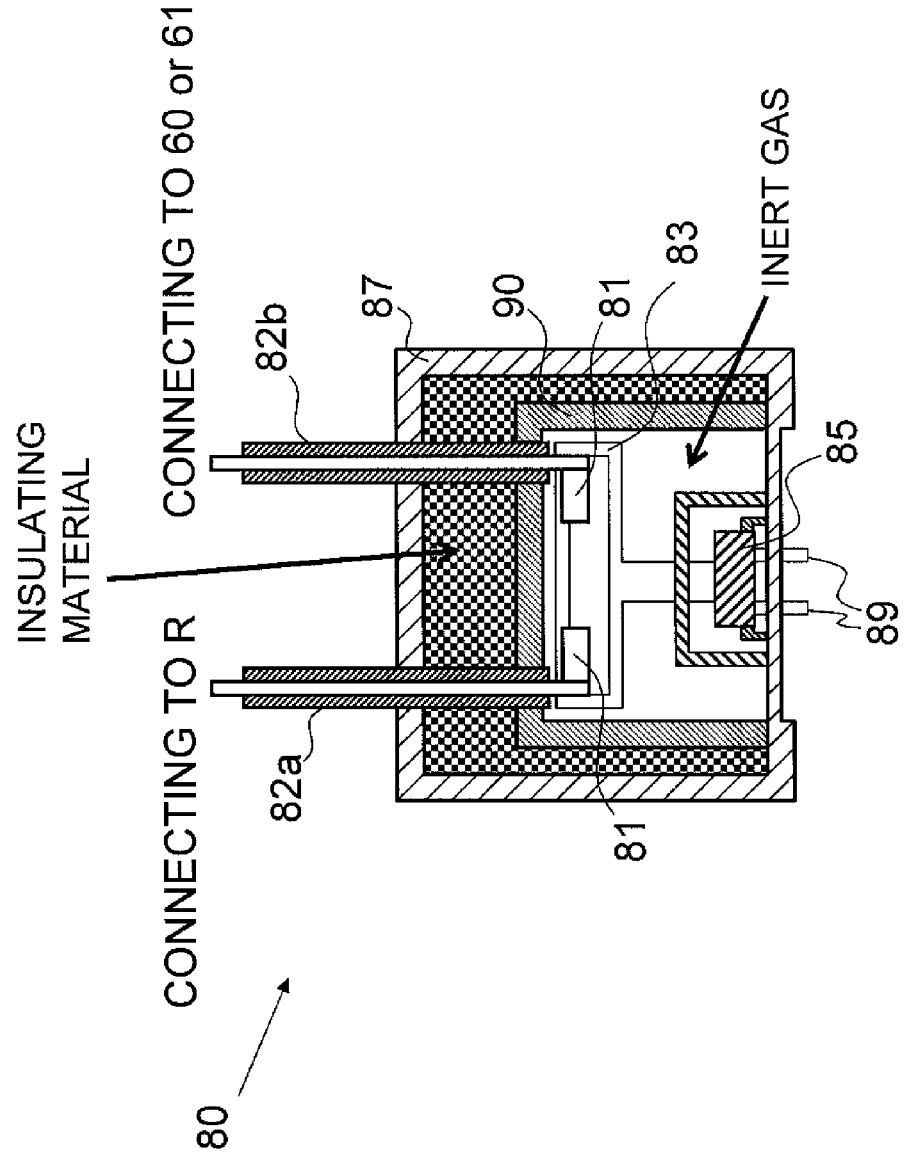
FIG. 11 is a cross-sectional configuration view illustrating a switching member differently structured from the switching member illustrated in FIG. 10.

Note that cables (a first cable 82*a* and a second cable 82*b*) protruding from the fixed contact points 81 to the outside of the case 87 may be provided instead of the first terminal 81*a* and the second terminal 81*b* (see FIG. 11).

The first cable 82*a* is connected at one side thereof to one fixed contact point 81 while the first cable 82*a* is connected at the other side thereof to a resistor R. The second cable 82*b* is connected at one side thereof to the other fixed contact point 81 while the second cable 82*b* is connected at the other side thereof to the connection cable 60 or the short-circuit bar 61.

A region of the inside of the case 87 which is in contact with the fixed contact point 81 for the first cable 82*a*, a region of the inside of the case 87 which is in contact with the fixed contact point 81 for the second cable 82*b*, and a region of the inside of the case 87 which contains the fixed contact point 81 and the movable contact point 83 are surrounded by a sealed container (internal case) 90, and the inside of the sealed container 90 is filled with an inert gas of, for example, nitrogen. An insulating member formed of, for example, butyl rubber is filled in a region between the sealed container 90 and the case 87 which contains at least the area between the first cable 82*a* and the second cable 82*b*, so that short-circuit does not occur between the first cable 82*a* and the second cable 82*b*.

FIG. 11 illustrates an example in which the insulating member is filled in all of the region between the sealed container 90 and the case 87. The region filled with the insulating member is represented by a checkered pattern. The lead line 86 (not shown in FIG. 11) is connected via a control terminal 89 extending from the driving member 85.

It is to be noted that although FIG. 11 illustrates the case where the first cable 82*a* and one fixed contact point 81 are arranged separately from each other and the second cable 82*b* and the other fixed contact point 81 are arranged separately from each other, the first cable 82*a* and one fixed contact point 81 may be arranged integrally with each other and the second cable 82*b* and the other fixed contact point 81 may be arranged integrally with each other so that the respective edges of the first and second cables 82*a* and 82*b* function as the fixed contact points 81 and are in contact with the movable contact point 83.

REFERENCE SIGNS LIST

1 dry-type load testing machine
10 frame
21-26 first to sixth resistance units
31-36 first to sixth cooling fans
31*a*-36*a* first to sixth hoods
40 connection switching section
50 insulator
60 connection cable
61 short-circuit bar
70 luggage room
80 switching member
81 fixed contact point
81*a*, 81*b* first and second terminals
82*a*, 82*b* first and second cables
83 movable contact point
85 driving member
86 lead line
87 case
88 insulating wall
89 control terminal
90 sealed container (internal case)
d1, d2 first and second distances

The invention claimed is:

1. A load testing machine, comprising:
a first resistance unit to a sixth resistance unit;
a first cooling fan to a sixth cooling fan;
insulators between the first to sixth resistance units and the first to sixth cooling fans; and
connection cables, wherein each of the first to sixth resistance units includes a plurality of steps of resistor groups each formed of a plurality of rod-shaped resistors parallel to a x-direction connected together electrically in series arranged at predetermined intervals in a y-direction vertical to the x-direction, the resistor groups being arranged in a z-direction vertical to the x-direction and the y-direction,
the first to sixth cooling fans face the first to sixth resistance units, respectively, in the z-direction,
the first to third resistance units are arranged in the x-direction at intervals of not smaller than a first distance,
the fourth to sixth resistance units are arranged in the x-direction at intervals of not smaller than the first distance,
the first and fourth resistance units are arranged in the y-direction at an interval of not smaller than a second distance,
the second and fifth resistance units are arranged in the y-direction at an interval of not smaller than the second distance,
the third and sixth resistance units are arranged in the y-direction at an interval of not smaller than the second distance,
the connection cables are cables used for electrically in series and detachably connecting, at more than one part, resistor groups next to each other in the y-direction of two resistance units next to each other in the y-direction with the interval of not smaller than the second distance in between, and
the insulators each have a size corresponding to a rated voltage of a target power supply of a power supply load test to be conducted using a resistance unit group, the resistance unit group having electrically in series connected resistors of two resistance units next to each other in the y-direction with the interval of not smaller than the second distance in between.

2. The load testing machine according to claim 1, wherein the first to sixth resistance units, the first to sixth cooling fans, the insulators, and the connection cables are contained in a luggage room, and the luggage room has a longitudinal direction parallel to the x-direction.

3. The load testing machine according to claim 1, wherein the interval of not smaller than the second distance is provided for obtaining insulation between resistance units next to each other in the y-direction, and
the first distance is larger than the second distance and is not shorter than 60 cm.

4. The load testing machine according to claim 1, wherein the insulators are provided between the first resistance unit and the fourth resistance unit, between the second resistance unit and the fifth resistance unit, and between the third resistance unit and the sixth resistance unit.

5. The load testing machine according to claim 1, wherein cylindrical hoods are provided between the first to sixth cooling fans and the first to sixth resistance units so that cooling wind from the first to sixth cooling fans is introduced to the first to sixth resistance units, and
an upper part of each cylindrical hood is located in the inside of a casing covering sides of the resistor group at a lowermost step and is separated from the casing at a distance of not smaller than 1 cm.

6. A load testing machine, comprising:
a first resistance unit to a sixth resistance unit;
a first cooling fan to a sixth cooling fan;
insulators between the first to sixth resistance units and the first to sixth cooling fans; and
either connection cables or short-circuit bars, wherein each of the first to sixth resistance units includes a plurality of steps of resistor groups each formed of a plurality of rod-shaped resistors parallel to a x-direction arranged at predetermined intervals in a y-direction vertical to the x-direction, the resistor groups being arranged in a z-direction vertical to the x-direction and the y-direction,
the first to sixth cooling fans face the first to sixth resistance units, respectively, in the z-direction,
the first to third resistance units are arranged in the x-direction at intervals of not smaller than a first distance,
the fourth to sixth resistance units are arranged in the x-direction at intervals of not smaller than the first distance,
the first and fourth resistance units are arranged in the y-direction at an interval of not smaller than a second distance,
the second and fifth resistance units are arranged in the y-direction at an interval of not smaller than the second distance,
the third and sixth resistance units are arranged in the y-direction at an interval of not smaller than the second distance,
either the connection cables or the short-circuit bars are connection members used for electrically in series and detachably connecting, at more than one part, resistor groups next to each other in the y-direction of two resistance units next to each other in the y-direction with the interval of not smaller than the second distance in between, and
the insulators each have a size corresponding to a rated voltage of a target power supply of a power supply load test to be conducted using a resistance unit group, the resistance unit group having electrically in series connected resistor groups of two resistance units next to each other in the y-direction with the interval of not smaller than the second distance in between.

7. The load testing machine according to claim 6, wherein either the connection cables or the short-circuit bars are connected to the resistor groups via a switching member, the switching member including a case containing a fixed contact point, a movable contact point, and a driving member that drives the movable contact point and being filled with an inert gas.

8. The load testing machine according to claim 7, wherein the switching member has a first terminal and a second terminal, the first terminal being connected to one of the resistors forming the resistor groups and the second terminal being connected to either the connection cable or the short-circuit bar, and
an insulating wall is formed between the first terminal and the second terminal.

9. The load testing machine according to claim 7, wherein the switching member has a first cable and a second cable, the first cable extending from the inside of the case and being connected to one of the resistors forming the resistor groups and the second cable being connected to either the connection cable or the short-circuit bar,
a region of the inside of the case which contains the fixed contact point and the movable contact point is covered with an internal case,
the inside of the internal case is filled with an inert gas, and
a region between the case and the internal case which includes at least an area between the first cable and the second cable is filled with an insulating material.

* * * * *